United States Patent
Lin et al.

(10) Patent No.: US 11,251,350 B2
(45) Date of Patent: Feb. 15, 2022

(54) LIGHT-EMITTING DIODE PACKAGE AND MANUFACTURING METHOD THEREOF

(71) Applicant: Unimicron Technology Corp., Taoyuan (TW)

(72) Inventors: Yi-Cheng Lin, Taichung (TW); Yu-Hua Chen, Hsinchu (TW); Chun-Hsien Chien, New Taipei (TW); Chien-Chou Chen, Hsinchu County (TW); Cheng-Hui Wu, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/281,108

(22) Filed: Feb. 21, 2019

(65) Prior Publication Data
US 2020/0161518 A1    May 21, 2020

(30) Foreign Application Priority Data
Nov. 21, 2018   (TW) ................. 107141372

(51) Int. Cl.
*H01L 33/62* (2010.01)
*H01L 33/52* (2010.01)
(Continued)

(52) U.S. Cl.
CPC .......... *H01L 33/62* (2013.01); *H01L 23/3114* (2013.01); *H01L 23/49827* (2013.01); *H01L 23/5383* (2013.01); *H01L 33/52* (2013.01)

(58) Field of Classification Search
CPC ..... H01L 33/52; H01L 23/3114; H01L 33/62; H01L 23/5383; H01L 25/167; H01L 23/5385; H01L 23/5389; H01L 23/49827
See application file for complete search history.

(56) References Cited

U.S. PATENT DOCUMENTS 9,691,707 B2   6/2017   Chi et al.
9,735,087 B2   8/2017   Chang et al.
(Continued)

FOREIGN PATENT DOCUMENTS

CN   101213661   7/2008
CN   107301957   10/2017
(Continued)

OTHER PUBLICATIONS

Yu et al., Study of 15μm Pitch Solder Microbumps for 3D IC Integration, 2009 Electronic Components and Technology Conference (Year: 2009).*
(Continued)

*Primary Examiner* — Shih Tsun A Chou
(74) *Attorney, Agent, or Firm* — JCIPRNET

(57) ABSTRACT

A light-emitting diode package including a carrier structure, a patterned conductive layer, at least one chip, a dielectric layer, at least one first conductive via, a build-up circuit structure, and at least one light-emitting diode is provided. The patterned conductive layer is disposed on the carrier structure. The chip is disposed on the carrier structure. The dielectric layer is disposed on the carrier structure and encapsulates the chip and the patterned conductive layer. The first conductive via penetrates the dielectric layer and is electrically connected to the patterned conductive layer. The build-up circuit structure is disposed on the dielectric layer and electrically connected to the first conductive via. The light-emitting diode is disposed on the build-up circuit structure.

7 Claims, 9 Drawing Sheets

(51) Int. Cl.
*H01L 23/538* (2006.01)
*H01L 23/498* (2006.01)
*H01L 23/31* (2006.01)

(56) References Cited

U.S. PATENT DOCUMENTS

| | | | | |
|---|---|---|---|---|
| 2009/0127702 | A1* | 5/2009 | Dekker | H01L 21/486 |
| | | | | 257/713 |
| 2012/0146209 | A1* | 6/2012 | Hu | H01L 23/36 |
| | | | | 257/692 |
| 2016/0133485 | A1* | 5/2016 | Benjamin | H01L 21/563 |
| | | | | 438/5 |
| 2017/0131487 | A1* | 5/2017 | Lee | G02B 6/4206 |
| 2017/0194302 | A1* | 7/2017 | Disney | H01L 24/16 |
| 2017/0271311 | A1* | 9/2017 | Lin | H01L 23/49827 |
| 2017/0301650 | A1* | 10/2017 | Yu | H01L 21/0214 |
| 2019/0206815 | A1* | 7/2019 | Laguvaram | H01L 23/642 |
| 2019/0279925 | A1* | 9/2019 | Hsu | H01L 25/0657 |

FOREIGN PATENT DOCUMENTS

| | | |
|---|---|---|
| CN | 108630658 | 10/2018 |
| TW | 200707677 | 2/2007 |
| TW | 201830598 | 8/2018 |
| TW | 201836099 | 10/2018 |

OTHER PUBLICATIONS

Takayasu Sakurai, Closed-Form Expressions for Interconnection Delay, Coupling, and Crosstalk in VLSI's, IEEE, Transactions on Electron Devices, vol. 40, No. 1, Jan. 1993 (Year: 1993).*

Wikipedia: Printed circuit board, archived Nov. 13, 2016 (Year: 2016).*

"Office Action of Taiwan Counterpart Application", dated Jul. 5, 2019, pp. 1-9.

"Office Action of China Counterpart Application", dated Feb. 2, 2021, p. 1-p. 10.

* cited by examiner

LIGHT-EMITTING DIODE PACKAGE AND MANUFACTURING METHOD THEREOF

CROSS-REFERENCE TO RELATED APPLICATION

This application claims the priority benefit of Taiwan application serial no. 107141372, filed on Nov. 21, 2018. The entirety of the above-mentioned patent application is hereby incorporated by reference herein and made a part of this specification.

BACKGROUND

Technical Field

The invention relates to a light-emitting diode (LED) package and a manufacturing method thereof, and particularly relates to a LED package having embedded chips and a manufacturing method thereof.

Description of Related Art

Presently, in a packaging process of micro LEDs, a redistribution circuit layer and solder joints are first formed on a printed circuit board (PCB), and then the micro LEDs are transferred to the solder joints on the PCB in mass transfer. However, due to a large warpage of a multilayer structure of the PCB, the micro LEDs are not easy to dock with a chip in the mass transfer, which results in a significant reduction in yield. Moreover, today's packaging technique of a driving IC makes an edge of a display panel having seam points, which not only decreases a usage rate of an effective area, but also forms a screen with an edge on a billboard. Namely, a TV wall or the billboard may have an obvious seam or black edge, which decreases a visual resolution.

SUMMARY

The invention is directed to a light-emitting diode (LED) package, which has a good yield.

The invention is directed to a manufacturing method of a LED package, which mitigates a problem of a large warpage of a printed circuit board (PCB).

The invention provides a LED package including a carrier structure, a patterned conductive layer, at least one chip, a dielectric layer, at least one first conductive via, a build-up circuit structure, and at least one LED. The patterned conductive layer is disposed on the carrier structure. The chip is disposed on the carrier structure. The dielectric layer is disposed on the carrier structure and encapsulates the chip and the patterned conductive layer. The first conductive via penetrates through the dielectric layer and is electrically connected to the patterned conductive layer. The build-up circuit structure is disposed on the dielectric layer and is electrically connected to the first conductive via. The LED is disposed on the build-up circuit structure.

In an embodiment of the invention, the build-up circuit structure and the carrier structure are respectively located at two opposite sides of the chip. The LED and the chip are respectively located at two opposite sides of the build-up circuit structure.

In an embodiment of the invention, the build-up circuit structure includes at least one circuit layer, at least one first dielectric layer and at least one first conductive hole. The circuit layer and the first dielectric layer are sequentially stacked on the dielectric layer. The first conductive hole penetrates through the first dielectric layer and is electrically connected to the circuit layer.

In an embodiment of the invention, the LED package further includes a solder mask layer, a pad, an adhesion layer and a transparent substrate. The solder mask layer is disposed on the build-up circuit structure. The pad is disposed in at least one opening of the solder mask layer, and is exposed out of the solder mask layer. The adhesion layer is disposed on the solder mask layer, and encapsulates the LED. The transparent substrate is disposed on the adhesion layer. The transparent substrate and the solder mask layer are respectively located at two opposite sides of the adhesion layer. The LED is disposed corresponding to the pad. The LED is electrically connected to the build-up circuit structure through the corresponding pad.

In an embodiment of the invention, the LED is electrically connected to the chip through the build-up circuit structure.

In an embodiment of the invention, an active surface of the chip faces the carrier structure. The carrier structure includes a substrate, a first conductive layer, a second dielectric layer, a plurality of solder balls, an adhesive layer, a second conductive layer, at least one second conductive via and at least one electronic element. The substrate has a first surface and a second surface opposite to each other. The first conductive layer is disposed on the first surface of the substrate. The second dielectric layer is disposed on the first surface of the substrate to encapsulate the first conductive layer. The solder balls are disposed in a plurality of openings of the second dielectric layer, and are exposed out of the second dielectric layer. The adhesive layer is disposed on the second dielectric layer and encapsulates the solder balls. The second conductive layer is disposed on the second surface of the substrate. The second conductive via penetrates through the substrate, and is electrically connected to the first conductive layer and the second conductive layer. The electronic element is disposed on the second surface of the substrate, and is electrically connected to the second conductive layer. The solder balls are exposed out of the adhesive layer to electrically connect the corresponding patterned conductive layer.

In an embodiment of the invention, the chip is disposed on the patterned conductive layer, and the active surface of the chip directly contacts the patterned conductive layer.

In an embodiment of the invention, the substrate includes a flexible substrate or a glass substrate.

In an embodiment of the invention, an active surface of the chip faces the build-up circuit structure, and the LED package further includes a second conductive hole. The second conductive hole is configured on the active surface of the chip, and is electrically connected to the build-up circuit structure.

In an embodiment of the invention, the carrier structure includes a flexible substrate or a glass substrate.

The invention provides a manufacturing method of a LED package including following steps. A temporary substrate is provided. A patterned conductive layer is formed on the temporary substrate. At least one chip is disposed on the temporary substrate. A dielectric layer is pressed on the temporary substrate, such that the dielectric layer encapsulates the chip and the patterned conductive layer. At least one first conductive via is formed. The first conductive via penetrates through the dielectric layer and is electrically connected to the patterned conductive layer. A build-up circuit structure is formed on the dielectric layer, such that the build-up circuit structure is electrically connected to the first conductive via. At least one LED is disposed on the build-up circuit structure. The temporary substrate is removed. The patterned conductive layer and a carrier structure are bonded.

In an embodiment of the invention, the temporary substrate includes a rigid substrate and a lift-off layer disposed on the rigid substrate. The patterned conductive layer and the rigid substrate are respectively located at two opposite sides of the lift-off layer.

In an embodiment of the invention, the manufacturing method of the LED package further includes following steps. Before the LED is disposed on the build-up circuit structure, a solder mask layer is formed on the build-up circuit structure, a pad is formed in at least one opening of the solder mask layer, and is exposed out of the solder mask layer. Before the temporary substrate is removed, an adhesion layer is pressed on the solder mask layer, and encapsulates the LED, and a transparent substrate is disposed on the adhesion layer. The transparent substrate and the solder mask layer are respectively located at two opposite sides of the adhesion layer. The LED is disposed corresponding to the pad. The LED is electrically connected to the build-up circuit structure through the corresponding pad.

In an embodiment of the invention, an active surface of the chip faces the carrier structure, and the step of forming the carrier structure includes following steps. First, a substrate is provided, where the substrate has a first surface and a second surface opposite to each other. At least one second conductive via is formed in the substrate, and the second conductive via penetrates through the substrate. Then, a first conductive layer is formed on the first surface of the substrate. A second conductive layer is formed on the second surface of the substrate. Then, a second dielectric layer is formed on the first surface of the substrate to encapsulate the first conductive layer. A plurality of solder balls are formed in a plurality of openings of the second dielectric layer, and are exposed out of the second dielectric layer. An adhesive layer is formed on the second dielectric layer to encapsulate the solder balls. Then, at least one electronic element is configured on the second conductive layer, where the second conductive via is electrically connected to the first conductive layer and the second conductive layer. The solder balls are exposed out of the adhesive layer to electrically connect the corresponding patterned conductive layer.

In an embodiment of the invention, the active surface of the chip faces the build-up circuit structure, and the manufacturing method of the LED package further includes following steps. Before the build-up circuit structure is formed on the dielectric layer, a second conductive hole is formed on the active surface of the chip, and is electrically connected to the build-up circuit structure.

Based on the above description, in the LED package and the manufacturing method thereof, the LED package includes the carrier structure, the patterned conductive layer, the at least one chip, the dielectric layer, the at least one first conductive via, the build-up circuit structure, and the at least one LED. The patterned conductive layer, the chip and the dielectric layer are disposed on the carrier structure, and the dielectric layer encapsulates the chip and the patterned conductive layer. The first conductive via penetrates through the dielectric layer and is electrically connected to the patterned conductive layer. The build-up circuit structure is disposed on the dielectric layer and is electrically connected to the first conductive via. The LED is disposed on the build-up circuit structure. Based on such design, the LED package and the manufacturing method thereof may mitigate the problem of a large warpage of the PCB, so as to achieve a good yield.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1G are cross-sectional views of a manufacturing method of a Light-Emitting Diode (LED) package according to an embodiment of the invention.

Figure 1A:
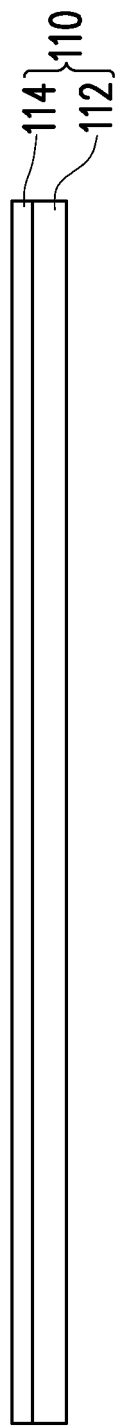
FIG. 1A to FIG. 1G are cross-sectional views of a manufacturing method of a Light-Emitting Diode (LED) package according to an embodiment of the invention.

Referring to FIG. 1A, in the embodiment, a temporary substrate 110 is first provided. The temporary substrate 110 includes a rigid substrate 112 and a lift-off layer 114 disposed on the rigid substrate. A material of the rigid substrate 112 includes a low Coefficient of Thermal Expansion (CTE) material, for example, glass, ceramics, etc., though the invention is not limited thereto. The lift-off layer 114 may be made of a polymeric material, and the polymeric material and the rigid substrate 112 may be removed together in a subsequent step. In some embodiments, the lift-off layer 114 is an epoxy resin-based thermal release material losing its adhesion properties when being heated, for example, a Light-To-Heat-Conversion (LTHC) release coating. In other embodiments, the lift-off layer 114 may be an Ultra-Violet (UV) adhesive losing its adhesion properties when being exposed to UV light.

Figure 1B:
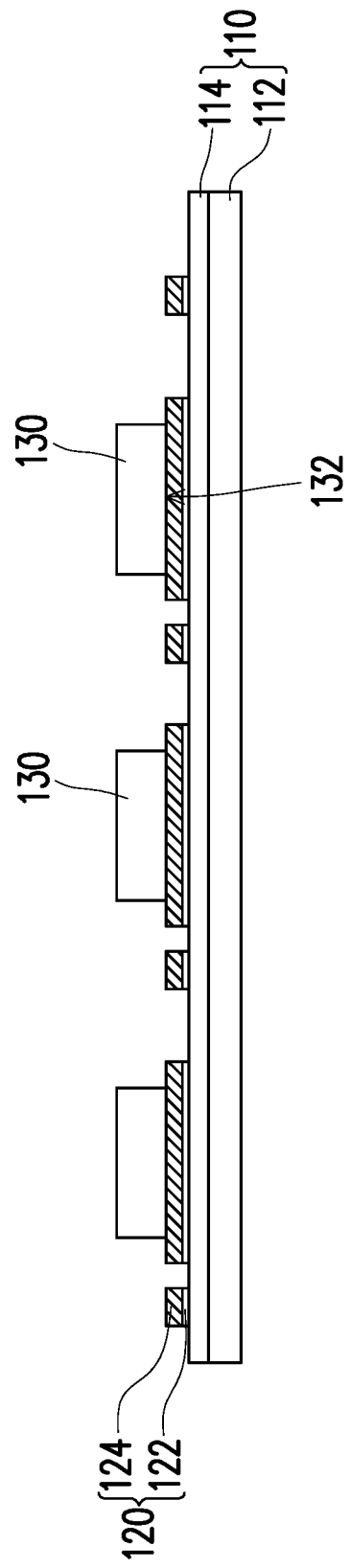

Referring to FIG. 1B, in the embodiment, a patterned conductive layer 120 is formed on the lift-off layer 114 of the temporary substrate 110. In the embodiment, a method of forming the patterned conductive layer 120 includes following steps, though the invention is not limited thereto. A crystal seed layer 122 is first formed on the lift-off layer 114. In some embodiments, the crystal seed layer 122 is a metal layer, and the metal layer may be a single layer or a composite layer including a plurality of sub-layers made of different materials. In some embodiments, the crystal seed layer 122 includes a titanium layer and a copper layer located on the titanium layer. A Physical Vapor Deposition (PVD) method, etc., may be adopted to form the crystal seed layer 122. Then, a photoresist (not shown) is formed on the crystal seed layer 122 and the photoresist is patterned. A spin coating method, etc., may be adopted to form the photoresist and the photoresist may be exposed to light for patterning. Then, a plating covering process such as electroplating, etc., is adopted to form a conductive material layer 124 in openings of the photoresist and on the exposed crystal seed layer 122. The conductive material layer 124 may be metal or metal alloy, for example, copper, titanium, tungsten, aluminum, etc., or a combination thereof. Then, the photoresist is removed and a part of the exposed crystal seed layer 122 is removed. Now, the other part of the crystal seed layer and the conductive material layer 124 form the patterned conductive layer 120. The patterned conductive layer 120 and the rigid substrate 112 are respectively located at two opposite sides of the lift-off layer 114.

Then, at least one chip 130 is disposed on the temporary substrate 110. In the embodiment, the chip 130 may be disposed on the patterned conductive layer 120, such that an active surface 132 of the chip 130 directly contacts the patterned conductive layer 120, and the active surface 132 of the chip 130 faces the lift-off layer 114, though the invention is not limited thereto. In other embodiments, the chip 130 may also be disposed on the lift-off layer 114, such that the chip 130 does not contact the patterned conductive layer 120, and the active surface 132 of the chip 130 back-faces the lift-off layer 114.

Figure 1C:
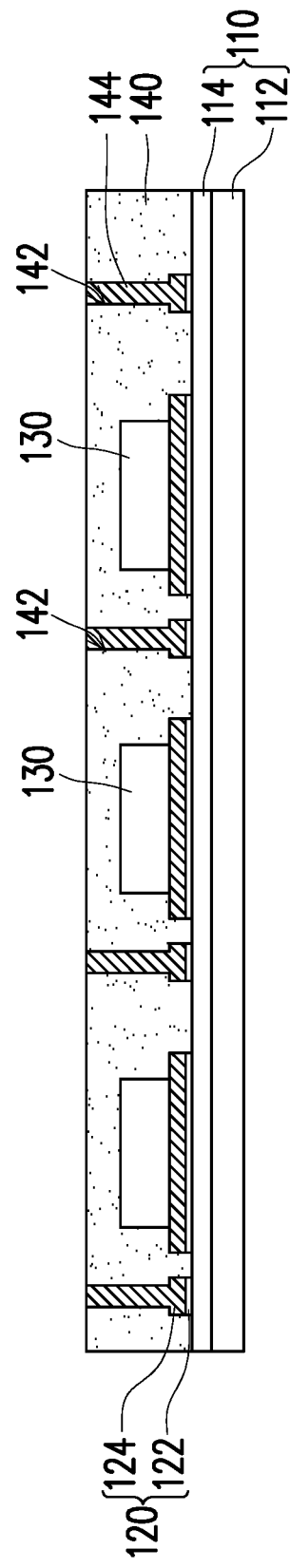

Referring to FIG. 1C, in the embodiment, a dielectric layer 140 is pressed on the lift-off layer 114 of the temporary substrate 110, such that the dielectric layer 140 encapsulates the chip 130 and the patterned conductive layer 120. The dielectric layer 140 may be made of a polymer, and the polymer is, for example, a photosensitive material that may be patterned by using a lithography mask, such as polybenzoxazole (PBO), polyimide, benzocyclobutene (BCB), etc.

Then, the dielectric layer 140 is patterned to form openings 142 exposing a part of the patterned conductive layer 120. Then, a plating covering process such as electroplating, etc., is adopted to form at least one first conductive via 144. The first conductive via 144 penetrates through the dielectric layer 140 and is electrically connected to the patterned conductive layer 120.

Figure 1D:
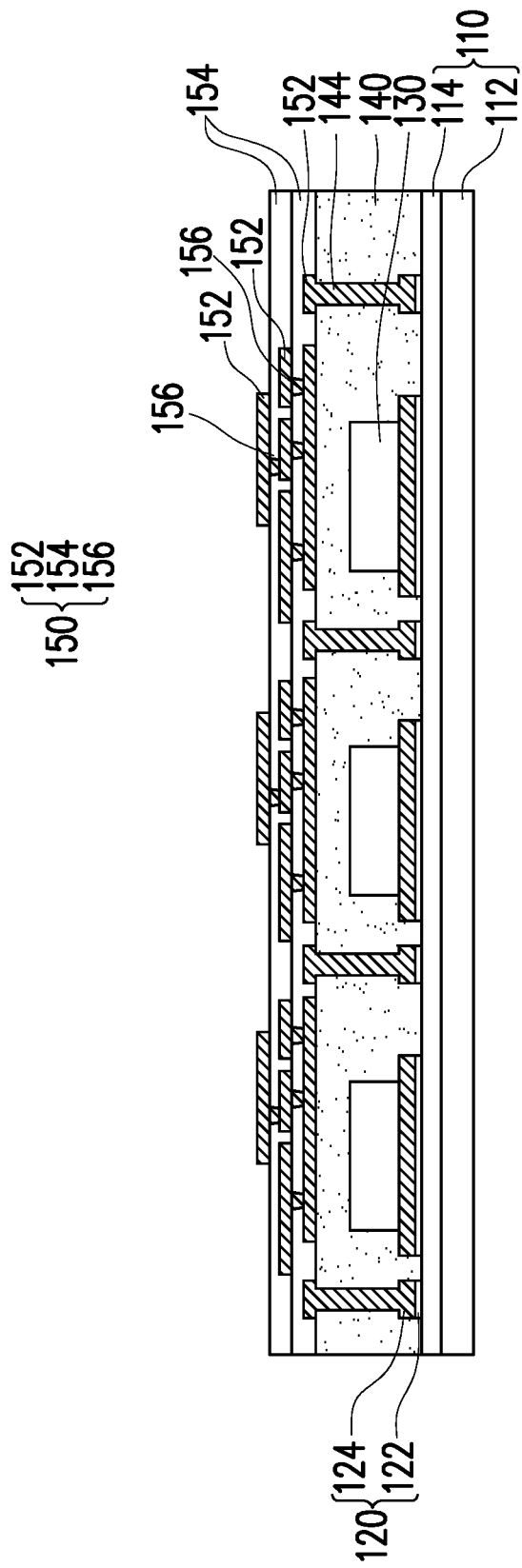

Referring to FIG. 1D, in the embodiment, a build-up circuit structure 150 is formed on the dielectric layer 140, and the build-up circuit structure 150 is electrically connected to the first conductive via 144. The build-up circuit structure 150 includes at least one circuit layer 152 (3 layers of the circuit layer 152 are schematically illustrated in FIG. 1D), at least one first dielectric layer 154 (2 layers of the first dielectric layer 154 are schematically illustrated in FIG. 1D) and at least one first conductive hole 156 (12 first conductive holes 156 are schematically illustrated in FIG. 1D). In the embodiment, a method of forming the build-up circuit structure 150 on the dielectric layer 140, for example, includes following steps, though the invention is not limited thereto. First, the circuit layer 152 of the build-up circuit structure 150 is formed on the dielectric layer 140 through a same method of forming the aforementioned patterned conductive layer 120, and the circuit layer 152 is electrically connected to the first conductive via 144. Then, the first dielectric layer 154 of the build-up circuit structure 150 is formed through a same method of forming the aforementioned dielectric layer 140. Thereafter, the first conductive hole 156 of the build-up circuit structure 150 is formed in the first dielectric layer 154, and the first conductive hole 156 penetrates through the first dielectric layers 154 and is electrically connected to the circuit layer 152. Then, the other circuit layers 152, the first dielectric layers 154 and the first conductive holes 156 are formed, such that the circuit layers 152 and the first dielectric layers 154 in the build-up circuit structure 150 are sequentially stacked on the dielectric layer 140.

Figure 1E:
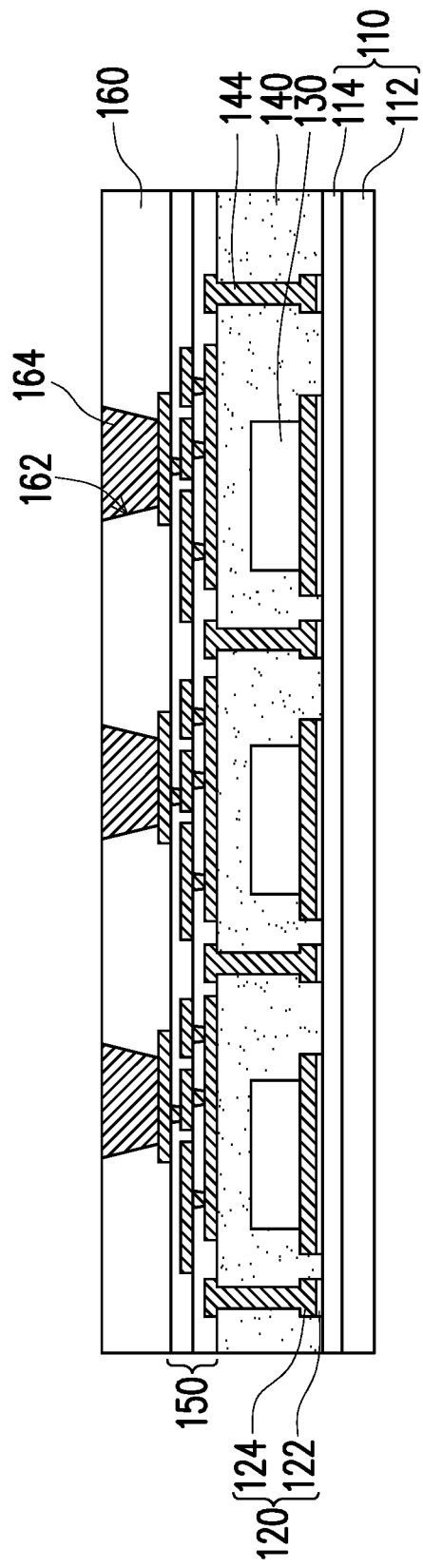

Referring to FIG. 1E, in the embodiment, before an LED 170 is disposed on the build-up circuit structure 150, a solder mask layer 160 is formed on the build-up circuit structure 150. Then, a pad 164 is formed in at least one opening 162 of the solder mask layer 160. In detail, the solder mask layer 160 is first formed on the build-up circuit structure 150, and an etching process is performed to the solder mask layer 160 to form the opening 162, where the opening 162 exposes a part of the outermost layer of the circuit layers 152 in the build-up circuit structure 150. Then, a soldering material is filled in the opening 162 to form the pad 164, where the soldering material is, for example, tin, though the invention is not limited thereto. In some embodiments, the pad 164 is exposed out of the solder mask layer 160. In some embodiments, the pad 164 is aligned with the solder mask layer 160.

In the embodiment, although the solder mask layer 160 is disposed on the build-up circuit structure 150, and the pad 164 is disposed in the opening 162 of the solder mask layer 160, the invention is not limited thereto, and in other embodiments, the dielectric layer may be disposed on the build-up circuit structure, and the pad is disposed in the opening of the dielectric layer.

Figure 1F:
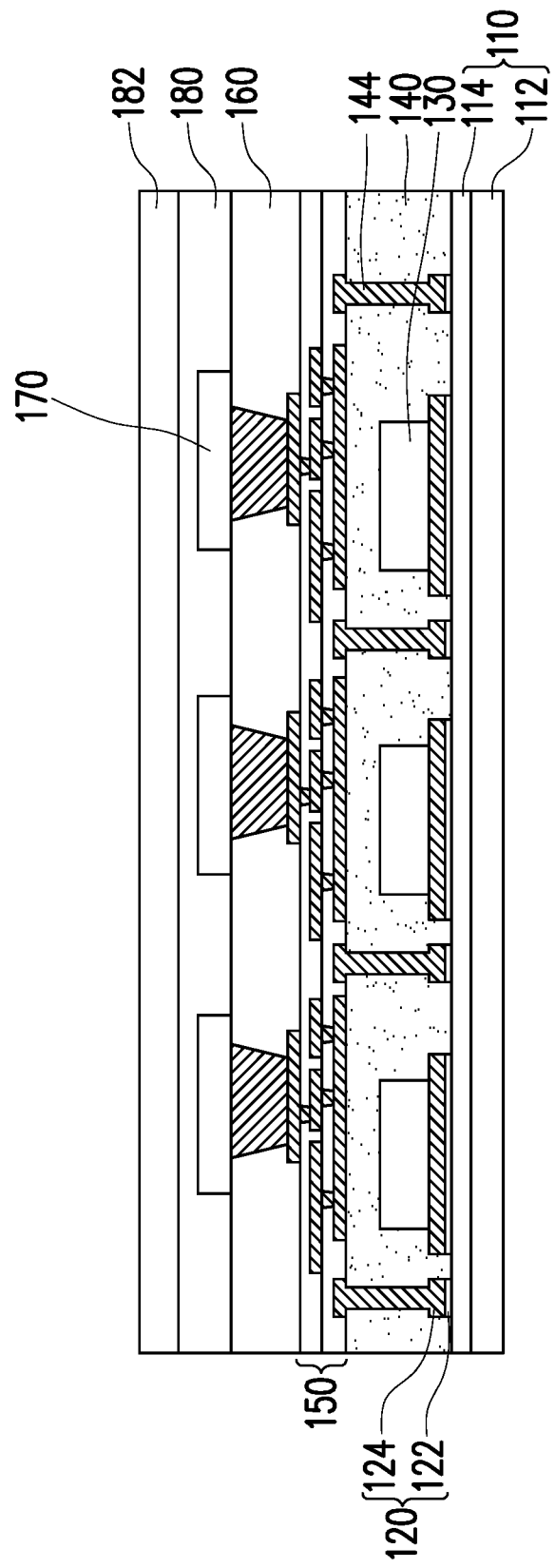

Referring to FIG. 1F, in the embodiment, at least one LED 170 is disposed on the build-up circuit structure 150, where the LED 170 and the chip 130 are respectively located at two opposite sides of the build-up circuit structure 150. In detail, the LED 170 is disposed corresponding to the pad 164, such that the LED 170 directly contacts the pad 164. In this case, the LED 170 may be electrically connected to the build-up circuit structure 150 through the corresponding pad 164, so as to electrically connect the chip 130. The LEDs 170 may include LEDs of different sizes, for example, micro LEDs, mini LEDs, etc., though the invention is not limited thereto. The LEDs may also include LEDs of different colors, for example, red, green, blue, etc., though the invention is not limited thereto.

Then, before the temporary substrate 110 is removed, an adhesion layer 180 is pressed on the solder mask layer 160. The adhesion layer 180 may encapsulate the LED 170. A material of the adhesion layer 180 includes a transparent material, such that light emitted by the LED 170 may penetrate through the adhesion layer 180. Then, a transparent substrate 182 is disposed on the adhesion layer 180, such that the transparent substrate 182 and the solder mask layer 160 are respectively located at two opposite sides of the adhesion layer 180. The transparent substrate 182 may include glass or transparent resin, though the invention is not limited thereto.

Figure 1G:
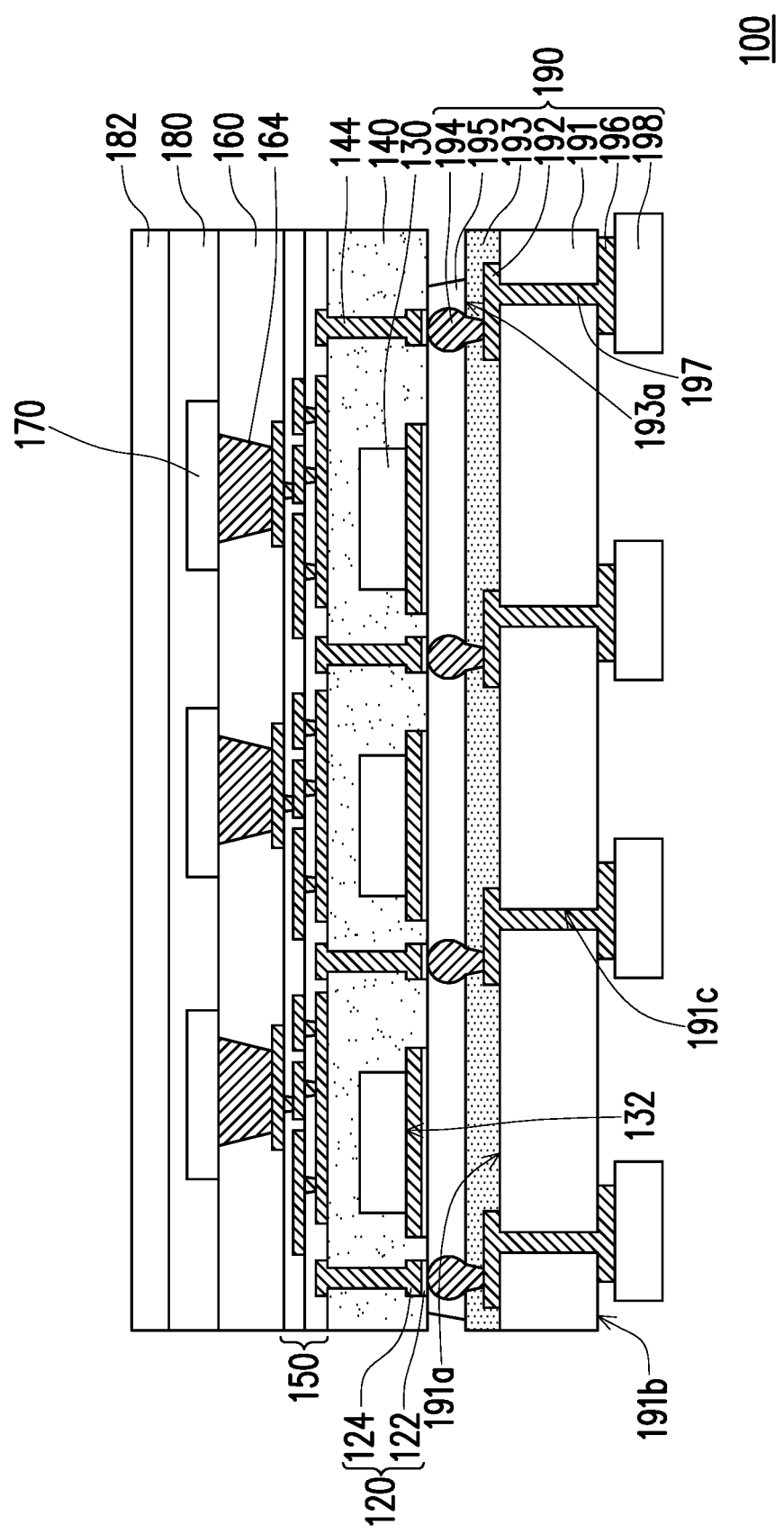

Referring to FIG. 1G, in the embodiment, the temporary substrate 110 is first removed, and then the patterned conductive layer 120 and a carrier structure 190 are bonded. In detail, before the temporary substrate 110 is removed, the carrier structure 190 is first formed. In the embodiment, a method of forming the carrier structure 190, for example, includes following steps, though the invention is not limited thereto.

First, a substrate 191 is provided. The substrate 191 may include a flexible substrate or a glass substrate. The substrate 191 has a first surface 191a and a second surface 191b opposite to each other. Then, an opening 191c is formed in the substrate 191, and the opening 191c connects the first surface 191a and the second surface 191b. A plating covering process such as electroplating, etc., is adopted to form a second conductive via 197 penetrating through the substrate 191. Then, a first conductive layer 192 is formed on the first surface 191a of the substrate 191, and exposes a part of the first surface 191a of the substrate 191. A second conductive layer 196 is formed on the second surface 191b of the substrate 191, and exposes a part of the second surface 191b of the substrate 191. The second conductive via 197 electrically connects the first conductive layer 192 and the second conductive layer 196. Then, a second dielectric layer 193 is formed on the first surface 191a of the substrate 191 to encapsulate the firs conductive layer 192 and cover the part of the substrate 191 exposed by the first conductive layer 192. A plurality of openings 193*a* is formed in the second dielectric layer 193, and the openings 193*a* expose a part of the first conductive layer 192. Then, a plurality of solder balls 194 is formed in the openings 193*a* of the second dielectric layer 193, where the solder balls 194 may be electrically connected to the first conductive layer 192, and exposed out of the second dielectric layer 193. Then, an adhesive layer 195 is formed on the second dielectric layer 193 to encapsulate the solder balls 194. Then, at least one electronic element 198 is disposed on the second conductive layer 196. The electronic element 198 may include an active element or a passive element, for example, a driving IC, a capacitor, etc. Until now, fabrication of the carrier structure 190 is completed.

Then, the temporary substrate 110 is removed, and the patterned conductive layer 120 and the carrier structure 190 are bonded. In detail, since the solder balls 194 of the carrier structure 190 are exposed out of the adhesive layer 195, when the patterned conductive layer 120 and the carrier structure 190 are bonded, the patterned conductive layer 120 may directly contact and electrically connect the corresponding solder balls 194 on the carrier structure 190. Therefore, the build-up circuit structure 150 and the carrier structure 190 are respectively located at two opposite sides of the chip 130, and the active surface 132 of the chip 130 faces the carrier structure 190. Until now, fabrication of the LED package 100 is completed.

In brief, the LED package 100 of the embodiment includes the carrier structure 190, the patterned conductive layer 120, the at least one chip 130, the dielectric layer 140, the at least one first conductive via 144, the build-up circuit structure 150 and the at least one LED 170. The patterned conductive layer 120 is disposed on the carrier structure 190. The chip 130 is disposed on the carrier structure 190. The dielectric layer 140 is disposed on the carrier structure 190 and encapsulates the chip 130 and the patterned conductive layer 120. The first conductive via 144 penetrates through the dielectric layer 140, and is electrically connected to the patterned conductive layer 120. The build-up circuit structure 150 is disposed on the dielectric layer 140, and is electrically connected to the first conductive via 144. The LED 170 is disposed on the build-up circuit structure 150. Based on such design, the LED package 100 of the embodiment and the manufacturing method thereof may mitigate the problem of a large warpage of a printed circuit board (PCB), so as to achieve a good yield.

Other embodiments are provided below for further description. It should be noted that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 2:
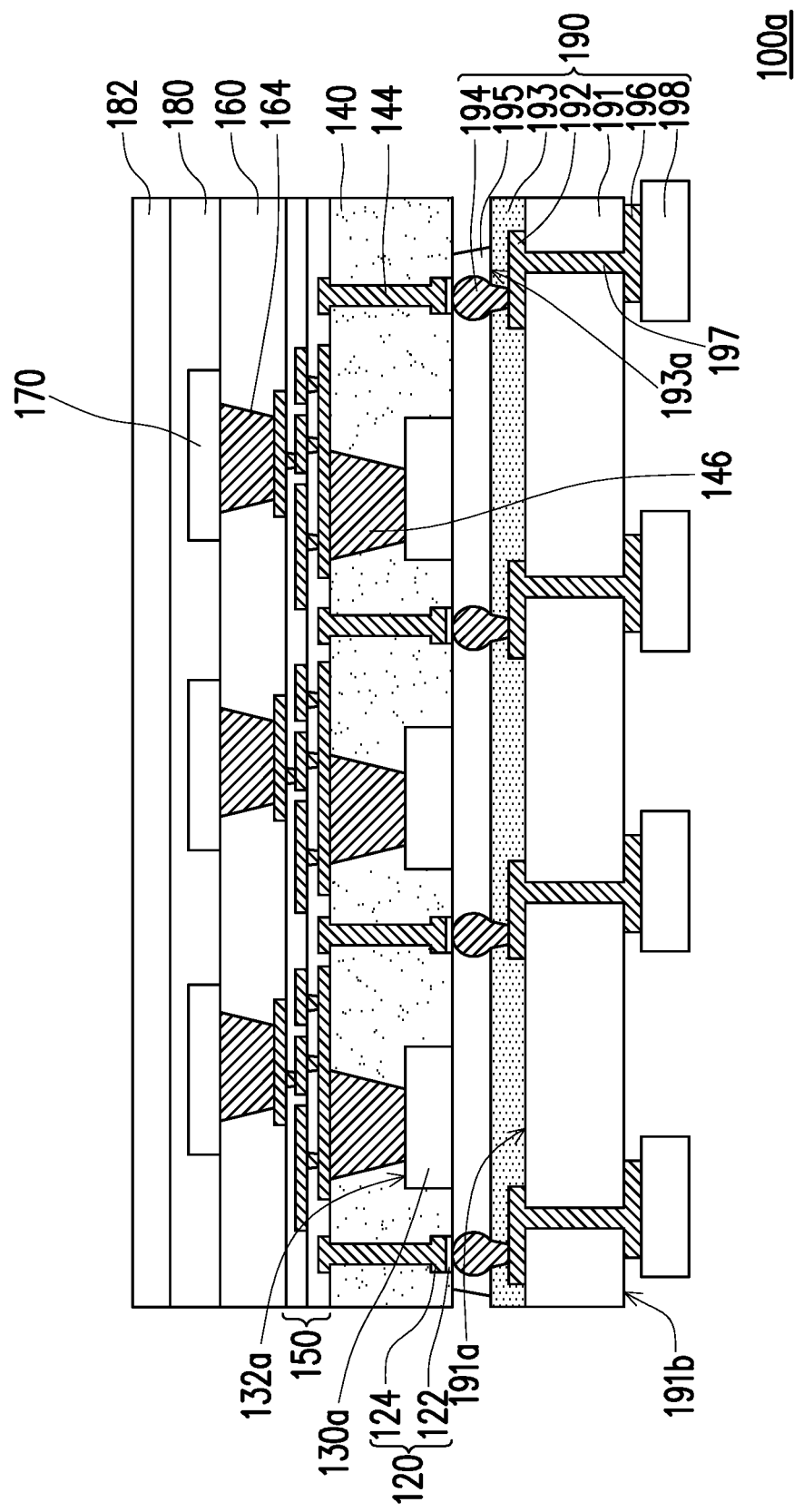
FIG. 2 is a cross-sectional view of an LED package according to another embodiment of the invention.

FIG. 2 is a cross-sectional view of an LED package according to another embodiment of the invention. Referring to FIG. 1G and FIG. 2, the LED package 100*a* of the embodiment is similar to the LED package 100 of FIG. 1G, and main differences there between are that in the LED package 100*a* of the embodiment, the active surface 132*a* of the chip 130*a* faces the build-up circuit structure 190, and the LED package 100*a* further includes a second conductive hole 146. The second conductive hole 146 is disposed on the active surface 132*a* of the chip 130*a*, and is electrically connected to the build-up circuit structure 150. In some embodiments, the chip 130*a* is directly disposed on the adhesive layer 195 of the carrier structure 190. In some embodiments, the chip 130*a* and the carrier structure 190 do not have the patterned conductive layer 120 there between.

Figure 3:
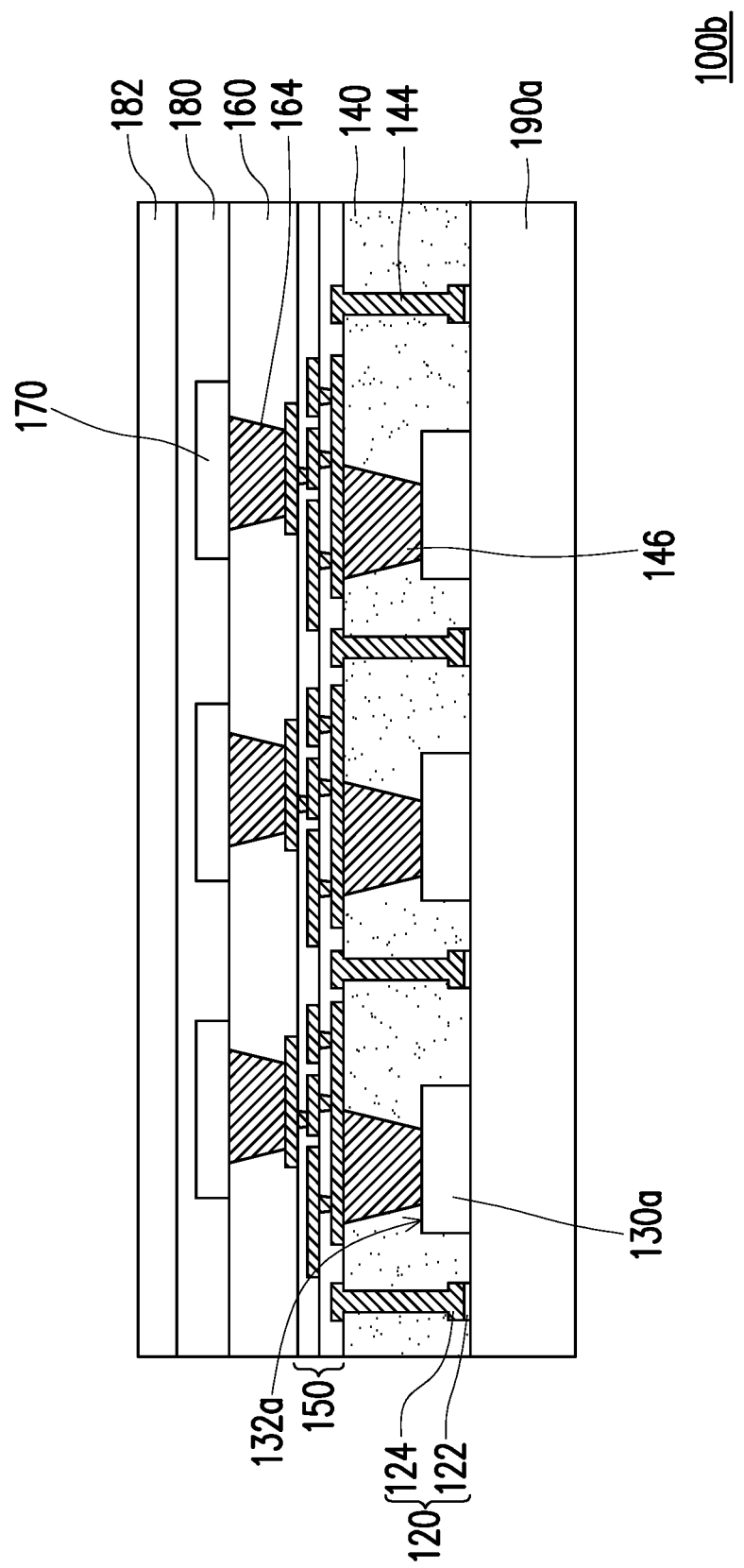
FIG. 3 is a cross-sectional view of an LED package according to another embodiment of the invention.

FIG. 3 is a cross-sectional view of an LED package according to another embodiment of the invention. Referring to FIG. 2 and FIG. 3, the LED package 100*b* of the embodiment is similar to the LED package 100*a* of FIG. 2, and a main difference there between is that in the LED package 100*b* of the embodiment, the carrier structure 190*a* does not include the first conductive layer, the second dielectric layer, the solder balls, the adhesive layer, the second conductive layer, the second conductive via and the electronic element. Namely, the chip 130*a* of the embodiment is directly disposed on the carrier structure 190*a*, and the carrier structure 190*a* is a flexible substrate or a glass substrate.

In summary, in the LED package and the manufacturing method thereof, the LED package includes the carrier structure, the patterned conductive layer, the at least one chip, the dielectric layer, the at least one first conductive via, the build-up circuit structure, and the at least one LED. The patterned conductive layer, the chip and the dielectric layer are all disposed on the carrier structure, and the dielectric layer encapsulates the chip and the patterned conductive layer. The first conductive via penetrates through the dielectric layer and is electrically connected to the patterned conductive layer. The build-up circuit structure is disposed on the dielectric layer and is electrically connected to the first conductive via. The LED is disposed on the build-up circuit structure. Based on such design, the LED package and the manufacturing method thereof may mitigate the problem of a large warpage of the PCB, so as to achieve a good yield.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A light-emitting diode package, comprising:
   a carrier structure;
   a patterned conductive layer, disposed on the carrier structure;
   at least one chip, disposed on the carrier structure, wherein the chip is disposed on the patterned conductive layer, and an active surface of the chip physically contacts the patterned conductive layer;
   a dielectric layer, disposed on the carrier structure, and encapsulating the chip and the patterned conductive layer;
   a plurality of first conductive vias, penetrating through the dielectric layer, and electrically connected to the patterned conductive layer;
   a build-up circuit structure, disposed on the dielectric layer, and electrically connected to the first conductive vias; and
   at least one light-emitting diode, disposed on the build-up circuit structure,
   wherein the build-up circuit structure comprises at least one circuit layer, at least one first dielectric layer and at least one first conductive hole, wherein the circuit layer and the first dielectric layer are sequentially stacked on the dielectric layer, the first conductive hole penetrates through the first dielectric layer and is electrically connected to the circuit layer, and a pitch between two adjacent pads in the circuit layer is smaller than a pitch between two adjacent pads in the patterned conductive layer, wherein the active surface of the chip faces the carrier structure, and the carrier structure comprises:
- a substrate, having a first surface and a second surface opposite to each other;
- a first conductive layer, disposed on the first surface of the substrate;
- a second dielectric layer, disposed on the first surface of the substrate, and encapsulating the first conductive layer;
- a plurality of solder balls, disposed in a plurality of openings of the second dielectric layer, and exposed out of the second dielectric layer;
- an adhesive layer, disposed on the second dielectric layer, and encapsulating the solder balls;
- a second conductive layer, disposed on the second surface of the substrate;
- a plurality of second conductive vias, penetrating through the substrate, and electrically connected to the first conductive layer and the second conductive layer; and
- at least one electronic element, disposed on the second surface of the substrate, and physically connected to the second conductive layer, wherein the solder balls are exposed out of the adhesive layer to electrically connect the corresponding patterned conductive layer, wherein each of the first conductive vias corresponds to each of the second conductive vias.

2. The light-emitting diode package as claimed in claim 1, wherein the build-up circuit structure and the carrier structure are respectively located at two opposite sides of the chip, and the light-emitting diode and the chip are respectively located at two opposite sides of the build-up circuit structure.

3. The light-emitting diode package as claimed in claim 1, further comprising:
- a solder mask layer, disposed on the build-up circuit structure;
- a pad, disposed in at least one opening of the solder mask layer, and exposed out of the solder mask layer;
- an adhesion layer, disposed on the solder mask layer, and encapsulating the light-emitting diode; and
- a transparent substrate, disposed on the adhesion layer, wherein the transparent substrate and the solder mask layer are respectively located at two opposite sides of the adhesion layer, the light-emitting diode is disposed corresponding to the pad, and the light-emitting diode is electrically connected to the build-up circuit structure through the corresponding pad.

4. The light-emitting diode package as claimed in claim 1, wherein the light-emitting diode is electrically connected to the chip through the build-up circuit structure.

5. The light-emitting diode package as claimed in claim 1, wherein the substrate comprises a flexible substrate or a glass substrate.

6. The light-emitting diode package as claimed in claim 1, wherein an active surface of the chip faces the build-up circuit structure, and the light-emitting diode package further comprises:
- a second conductive hole, configured on the active surface of the chip, and electrically connected to the build-up circuit structure.

7. The light-emitting diode package as claimed in claim 6, wherein the carrier structure comprises a flexible substrate or a glass substrate.

* * * * *